(12) United States Patent
Koinuma et al.

(10) Patent No.: US 7,911,927 B2
(45) Date of Patent: Mar. 22, 2011

(54) LAYERED BI COMPOUND NANOPLATE ARRAY OF SUCH NANOPLATES, THEIR MAKING METHODS AND DEVICES USING THEM

(75) Inventors: Hideomi Koinuma, Suginami-ku (JP); Yuji Matsumoto, Yokohama (JP); Ryota Takahashi, Setagaya-ku (JP)

(73) Assignee: Japan Science and Technology Agency, Saitama (JP)

( * ) Notice: Subject to any disclaimer, the term of this patent is extended or adjusted under 35 U.S.C. 154(b) by 439 days.

(21) Appl. No.: 11/659,428

(22) PCT Filed: Aug. 1, 2005

(86) PCT No.: PCT/JP2005/014047
§ 371 (c)(1),
(2), (4) Date: Nov. 7, 2008

(87) PCT Pub. No.: WO2006/013826
PCT Pub. Date: Feb. 9, 2006

(65) Prior Publication Data
US 2009/0213636 A1    Aug. 27, 2009

(30) Foreign Application Priority Data
Aug. 6, 2004 (JP) ................................ 2004-230529

(51) Int. Cl.
*G11B 7/00* (2006.01)
(52) U.S. Cl. .................................................. 369/126
(58) Field of Classification Search ............ None
See application file for complete search history.

(56) References Cited

U.S. PATENT DOCUMENTS

| 6,325,904 B1* | 12/2001 | Peeters | 257/414 |
| 2003/0200916 A1* | 10/2003 | Hase | 117/89 |
| 2005/0036939 A1* | 2/2005 | Wong et al. | 423/598 |

FOREIGN PATENT DOCUMENTS

JP    2005-272129 A    10/2005

OTHER PUBLICATIONS

J.F. Scott, translated jointly into Japanese by Hitohiro Tanaka, Kaoru Miura, and Chiharu Isobe, "Ferroelectric Memory (from its Physics to Applications)", Springer-Fairlark Tokyo, 1st Ed, Nov. 7, 2003, pp. 163. Mentioned on pp. 1-3 of the as-filed translation of the specification as concise explanation of relevance.

(Continued)

*Primary Examiner* — Joseph Haley
(74) *Attorney, Agent, or Firm* — Chen Yoshimura LLP

(57) ABSTRACT

A $Bi_4Ti_3O_{12}$ nanoplate, an array of such $Bi_4Ti_3O_{12}$ nanoplate and their making methods as well as their applications are provided. Using a vapor phase growth method, a flux layer of $VO_x$ is deposited on a $SrTiO_3$ (001) faced substrate and then $Bi_4Ti_3O_{12}$ is deposited on the flux layer. A $Bi_4Ti_3O_{12}$ single crystal nanoplate is formed standing up on the flux layer in the form of a rectangular solid whose independent three sides are crystallographically oriented in directions coincident with particular crystallographic directions of the single crystal substrate, respectively. The nanoplates as a nanostructure grown by the bottom-up method are substantially fixed in shape and are densely arrayed not in contact with one another, and are applicable to a low-cost ferroelectric memory and the like.

10 Claims, 13 Drawing Sheets

OTHER PUBLICATIONS

Ryuta Takahashi et al., "High Temperature Superconduction by Tri-phase Epitaxy, Preparation of Single Crystal Thin Films" Journal of the Japan Institute of Metals, vol. 66, No. 4 (2002), 284-288, Special Edition "Recent Superconducting Meterials" Mentioned on pp. 1-3 of the as-filed translation of the specification as concise explanation of relevance.

S. Miyazaki et al., "Control of self-assembling formation of nanometer silicon dots by low pressure chemical deposition", Thin Solid Films 369 (2000), 55-59. Mentioned on pp. 1-3 of the as-filed translation of the specification as concise explanation of relevance.

M. Alexe et al., "Self-patterning nano-electrodes on ferroelectric thin films for gigabit memory applications" Applied Physics Letters vol. 73, No. 11, Sep. 14, 1998, 1592-1594. Mentioned on pp. 1-3 of the as-filed translation of the specification as concise explanation of relevance.

Wei F. Yao et al., "Synthesis and photocatalytic property of bismuth titanate $Bi_4Ti_3O_{12}$" Material Letters 57 (2003), 1899-1902. Mentioned on pp. 1-3 of the as-filed translation of the specification as concise explanation of relevance.

Translation of PCT/IB/237 in PCT/JP2005/014047.

* cited by examiner

Step 1: Depositing VOx on SrTiO3(001) Substrate

Step 2: Depositing Bi4Ti3O12 on VOx

Step 3: Cooling to Room Temperature (a)

(b)

(a)

(b)

(c)

(d)

(a)

(b)

(c)

LAYERED BI COMPOUND NANOPLATE ARRAY OF SUCH NANOPLATES, THEIR MAKING METHODS AND DEVICES USING THEM

TECHNICAL FIELD

The present invention relates to a layered Bi compound nanoplate and a layered Bi compound nanoplate array in which such nanoplates are arrayed as well as their making methods and devices using them.

BACKGROUND ART

In recent years, among multi-component oxides containing bismuth as a constituent element, Aurivillius layered Bi compounds (see Nonpatent Reference 1) have attracted attention for their good ferroelectric property. An Aurivillius layered Bi compound has its chemical composition expressed by formula: $(Bi_2O_2)A_{m-1}B_mO_{3m+1}$ (where A is Sr, Ba, Ca or Bi, B is Ti, Ta or Nb and $m \geq 1$. Composition $Bi_4Ti_3O_{12}$, which is where in the chemical composition formula, A is Bi, B is Ti sand m is 3, is especially excellent in ferroelectric property and its practical use as a FeRAM (Ferroelectric Random Access Memory) material is being investigated. Compound $Bi_4Ti_3O_{12}$ is a material having its complex composition and structure in which three layers of $TiO_6$ octahedron as a perovskite type slab structure and a $Bi_2O_2$ layer are alternately disposed. Consequently, to form a thin film of crystal perfection of a level such that it can be used as a FeRAM, the conventional epitaxy method makes it hard to achieve this goal and the present inventors have already proposed the flux epitaxy (see Nonpatent Reference 2 and Patent Reference 1). According to this method, it is possible to manufacture a $Bi_4Ti_3O_{12}$ single crystal thin film having a crystal perfection to an extent that it justifies its use as a FeRAM.

Aurivillius layered Bi compounds are excellent not only in ferroelectric property but also in piezoelectric and pyroelectric properties. By the way, attention has been riveted to MEMS (Micro-electro-mechanical system) techniques. MEMS is a system in which a microelectronic integrated circuit, a microminiature sensor and an actuator are integrated on, for example, a substrate such as Si single crystal, and as it were a system that puts a brain, an eye and an arm together to integrate the miniaturization, energy saving and high reliability. It is used, for example, in airbag systems in automobiles or a printer for personal computer, becoming an indispensable technique in the current society. MEMSs, those are also indispensable techniques for high-functionalization of mobile phones, biochips and others, have vigorously been investigated and developed. The size required for such sensors and actuators is in the order of μm or even sub μm, and the materials that can fully exhibit their functions and the manufacturing techniques for forming those of this size are being searched for.

The conventional method of making microminiature sensors and actuators necessary in MEMSs is what is called top-down method. The top-down method is a process that is carving a micro-configured component from a bulk single crystal using a semiconductor photolithographic technique. This method, however, becomes extremely costly if the size of a component to be fabricated is down to sub μm order. That is, in the lithographic technique for sub μm or less, very-short ultraviolet ray or X ray must be the exposure light source and the cost for such an exposure apparatus is extremely high. Also, using electron beam for exposure makes the throughput low and the production cost high.

As a process to attempt to solve such problems, the so-called bottom-up method has drawn attention in recent years. The bottom-up method is a method of fabrication that utilizes the nature of atoms and molecules to spontaneously create an orderly structure by the properties they originally possess, i.e., the self-organization. As an example of the bottom-up method, there is a process of making Si nanodots (see Nonpatent Reference 3). In this method, Si nanodots of single crystal are spontaneously formed in the form of islands on a substrate by subjecting the substrate to LPCVD (low pressure chemical vapor deposition) with silane gas upon causing Si of $SiO_2$ to be terminated with hydroxyl group by hydrofluoric-treatment, and such nanodots have been used as quantum dots for a single-electron transistor. It is also known that when a $Bi_4Ti_3O_{12}$ thin film with excessive Bi is epitaxially grown on an LSCO ($La_{0.5}Sr_{0.5}CoO_3$) substrate, Bi nanodots are spontaneously arrayed orderly on the $Bi_4Ti_3O_{12}$ thin film (see Nonpatent Reference 5). It has been investigated if such nanodots can be utilized as FeRAM electrodes.

Reference cited:

Nonpatent Reference 1: J. F. Scott, translated jointly by Hitohiro Tanaka, Kaoru Miura, and Chiharu Isobe "Ferroelectric Memory (from its Physics to Applications)", Springer-Fairlark Tokyo, 1st Ed, page 0.163;

Nonpatent Reference 2: Ryuta Takahashi et al., "High Temperature Superconduction by Tri-phase Epitaxy, Preparation of Single Crystal Thin Films" Journal of the Japan Institute of Metals, Vol. 66, No. 4 (2002), 284-288, Special Edition "Recent Superconducting Materials";

Nonpatent Reference 3: S. Miyazaki et al., "Control of self-assembling formation of nanometer silicon dots by low pressure chemical deposition", Thin Solid Films 369 (2000), 55-59;

Nonpatent Reference 4: M. Alexe et al., "Self-patterning nano-electrode on ferroelectric thin films for gigabit memory applications" APPLIED PHYSICS LETTERS Volume 73, Number 11, 14 September (1998), 1592-1594;

Nonpatent Reference 5: Wei F. Yao et al., "Synthesis and photocatalytic property of bismuth titanate Bi4Ti3O12" Material Letters 57 (2003), 1899-1902; and Patent Reference 1: Japanese Patent Application No. 2004-85232

DISCLOSURE OF THE INVENTION

Problems to be Solved by the Invention

Inasmuch as an Aurivillius layered Bi compound is a material having piezoelectric and pyroelectric properties that can be used to make a microminiature actuator or sensor for a MEMS, it will become possible to make at low cost a microminiature actuator or sensor required for a MEMS if a nanostructure of Aurivillius layered Bi compound can be made in a bottom-up method. Also, while in the conventional FeRAM using an Aurivillius layered Bi compound single crystal thin film, it has been necessary to separate cells by machining the layered Bi compound single crystal thin film to electrically separate the memory cells or, without separating the cells, to prevent cell-cell interference by making electrodes sufficiently apart at the sacrifice of a degree of integration; if a structure in which nanostructures of Aurivillius layered Bi compound are orderly arrayed could be made in a bottom-up method, it should be possible to make these nanostructures memory cells one by one and to make up a ferroelectric memory without entailing any process step of separating the cells and without sacrificing the degree of integration.

In view of the problems mentioned above, it is an object of the present invention to provide an Aurivillius layered Bi compound nanoplate, an array of such nanoplates, methods of making the nanoplate and nanoplate arrays, and devices using them.

Means for Solving the Problems

In order to achieve the object mentioned above, there is provided in accordance with the present invention a layered Bi compound nanoplate characterized in that it consists of an Aurivillius layered Bi compound single crystal having a composition expressed by formula: $(Bi_2O_2)A_{m-1}B_mO_{3m+1}$ where A is Sr, Ba, Ca or Bi, B is Ti, Ta or Nb and $m \geq 1$.

The said layered Bi compound nanoplate may have its composition expressed by $Bi_4Ti_3O_{12}$ and its crystal structure that is a perovskite slab type layered single crystal structure and be in the form of a rectangular solid having three independent sides in [1-10], [001] and [110] directions of the said crystal structure and of which the sides in the [110] and [1-10] directions have a length of about 1 μm and the side in the [001] direction has a length of about 300 nm or the sides in the [110] and [001] directions have a length of about 1 μm and the side in the [1-10] direction has a length of about 300 nm.

There is also provided in accordance with the present invention a layered Bi compound nanoplate array characterized in that it comprises a single-crystal substrate, a $VO_x$ flux layer (where x is a composition ratio; $1 \leq x \leq 2.5$) disposed on the single crystal substrate and a plurality of Aurivillius layered Bi compound nanoplates disposed on the flux layer wherein the nanoplates are arrayed on the flux layer so that three independent sides of each of the nanoplates are crystallographically oriented in directions which are coincident with particular crystallographic directions of the single crystal substrate and wherein the nanoplates are arrayed not in contact with one another.

There is also provided in accordance with the present invention a layered Bi compound nanoplate array characterized in that it comprises a single-crystal substrate, a $VO_x$ flux layer (where x is a composition ratio; $1 \leq x \leq 2.5$) disposed on the single crystal substrate and a plurality of layered Bi compound nanoplates having its composition expressed by $Bi_4Ti_3O_{12}$ and its crystal structure that is a perovskite slab type layered structure disposed on the flux layer wherein the nanoplates are arrayed on the flux layer so that the three independent sides of each of the nanoplates are crystallographically oriented in directions which are coincident with particular crystallographic directions of the single crystal substrate and wherein the nanoplates are arrayed not in contact with one another.

The single crystal substrate is preferably a $SrTiO_3$ single crystal substrate, a Nb doped $SrTiO_3$ single crystal substrate, a $LaAlO_3$ single crystal substrate, a $(LaAlO_3)_{0.3}(Sr_2AlTaO_6)_{0.7}$ single crystal substrate, a Si single crystal substrate, a $NdGaO_3$ single crystal substrate, a YSZ single crystal substrate, an $Al_2O_3$ single crystal substrate, a LaSrAlO_4 single crystal substrate, a MgO single crystal substrate or a $LaSrGaO_4$ single crystal substrate.

The single crystal substrate which is electrically conductive preferably comprises a single-crystal substrate selected from the group which consists of a $SrTiO_3$ single crystal substrate, a $LaAlO_3$ single crystal substrate, a $(LaAlO_3)_{0.3}(Sr_2AlTaO_6)_{0.7}$ single crystal substrate, a Si single crystal substrate, a $NdGaO_3$ single crystal substrate, a YSZ single crystal substrate, an $Al_2O_3$ single crystal substrate, a LaSrAlO_4 single crystal substrate, a MgO single crystal substrate and a $LaSrGaO_4$ single crystal substrate and a conductive thin film deposited thereon wherein the thin film is of a material selected from the group which consists of Pr, Ir, $IrO_2$, $RuO_2$, $La_{0.5}Sr_{0.5}CoO_3$, $LaNiO_3$ and $SrRuO_3$.

In the said layered Bi compound nanoplate array, the single crystal substrate is a $SrTiO_3$ single crystal substrate and the three independent sides of each of the nanoplates are crystallographically oriented in directions coincident with particular crystallographic directions of the single crystal substrate such that these sides are oriented in [1-10], [001] and [110] crystallographic directions of the crystal structure of the compound, which are coincident, respectively, with [100], [010] and [001] crystallographic directions of the single crystal substrate and wherein the nanoplates arrayed not in contact with one another are arrayed spaced from one another by a distance of about 500 nm or less.

There is further provided in accordance with the present invention a method of making a layered Bi compound nanoplate array, characterized in that it comprises the steps, in a vapor phase growth method in an oxygen atmosphere of a selected pressure, of depositing a flux layer of $VO_x$ (where $1 \leq x \leq 2.5$) on a selected single crystal substrate at a selected temperature and depositing a material whose composition is expressed by formula: $(Bi_2O_2)A_{m-1}B_mO_{3m+1}$ (where A is Sr, Ba, Ca or Bi, B is Ti, Ta or Nb and $m \geq 1$) on the flux layer at a selected temperature.

There is further provided in accordance with the present invention a method of making a layered Bi compound nanoplate array, characterized in that it comprises the steps, in a vapor phase growth method in an oxygen atmosphere of a selected pressure, of depositing a flux layer of $VO_x$ (where $1 \leq x \leq 2.5$) on a selected single crystal substrate at a selected temperature and depositing $Bi_4Ti_3O_{12}$ on the flux layer at a selected temperature.

The single crystal substrate is preferably a $SrTiO_3$ single crystal substrate, a Nb doped $SrTiO_3$ single crystal substrate, a $LaAlO_3$ single crystal substrate, a $(LaAlO_3)_{0.3}(Sr_2AlTaO_6)_{0.7}$ single crystal substrate, a Si single crystal substrate, a $NdGaO_3$ single crystal substrate, a YSZ single crystal substrate, an $Al_2O_3$ single crystal substrate, a LaSrAlO_4 single crystal substrate or a $LaSrGaO_4$ single crystal substrate. The single crystal substrate if to be electrically conductive depending on applications should preferably comprise a single crystal substrate selected from the group which consists of a $SrTiO_3$ single crystal substrate, a $LaAlO_3$ single crystal substrate, a $(LaAlO_3)_{0.3}(Sr_2AlTaO_6)_{0.7}$ single crystal substrate, a Si single crystal substrate, a $NdGaO_3$ single crystal substrate, a YSZ single crystal substrate, an $Al_2O_3$ single crystal substrate, a LaSrAlO_4 single crystal substrate, a MgO single crystal substrate and a $LaSrGaO_4$ single crystal substrate and a thin film deposited thereon wherein the thin film is of a material selected from the group which consists of Pr, Ir, $IrO_2$, $RuO_2$, $La_{0.5}Sr_{0.5}CoO_3$, $LaNiO_3$ and $SrRuO_3$.

In the method of making a $Bi_4Ti_3O_{12}$ nanoplate array, it is preferable that the flux layer of $VO_x$ has a thickness of 30 nm to 60 nm and the flux layer is deposited on said substrate at the temperature between 500° C. and 700° C. and $Bi_4Ti_3O_1$ is deposited at a selected temperature of 700° C., by ablating a $VO_x$ target and a $Bi_4Ti_3O_{12}$ target, each in an oxygen atmosphere with a KrF excimer pulsed laser. The KrF excimer pulsed laser preferably has an intensity of 1 J/cm² and is irradiated at a rate of 10 Hz.

Although the precise mechanism whereby the $Bi_4Ti_3O_{12}$ nanoplate array can be formed by the method mentioned above has not been fully clarified as yet, in view of the fact that $VO_x$ is a material forming an eutectic with $Bi_4Ti_3O_{12}$ but not forming any compound with $Bi_4Ti_3O_{12}$, it is considered that when $Bi_4Ti_3O_{12}$ is deposited on $VO_x$ at a substrate temperature of 700° C., $VO_x$ and $Bi_4Ti_3O_{12}$ diffuse into each other in solid state, forming the eutectic while growing epitaxially. Also, since the eutectic state is in a liquid state, it is considered that the conditions under which $Bi_4Ti_3O_{12}$ grows epitaxially are close to those of crystal growth from a thermal equilibrium state, and under such epitaxial conditions and by special effects of $VO_x$, the $Bi_4Ti_3O_{12}$ nanoplate array of a spontaneously orderly structure is grown.

A layered Bi compound nanoplate according to the present invention can be made by separating a layered Bi compound nano plate with a physical force or with a chemical agent from said layered Bi compound nanoplates in an array made by a method as mentioned above.

The present invention also provides a ferroelectric memory made of a layered Bi compound nanoplate array, characterized in that it comprises a layered Bi compound nanoplate array as mentioned above and a read and write unit disposed above the said array wherein nanoplates of said nanoplate array constitute individual memory cells.

The read and write unit here preferably comprises: a cantilever having a probe disposed above the nanoplate array; a cantilever moving means for moving said cantilever; a power supply for driving the cantilever moving means to bring the probe into contact with a top of a selected nanoplate in the nanoplate array and for generating a write voltage to be applied between the probe and the single crystal substrate for said array; a voltage detector for reading a voltage between the probe and the lower electrode when the probe is brought into contact with the top of the selected nanoplate by driving the cantilever moving means; and a computer responsive to an external command for controlling operations of the moving means, the power supply and the voltage detector to effect and sense an electric polarization as information for a said nanoplate in response to external commands, respectively.

A piezoelectric element made of a layered Bi compound nanoplate according to the present invention is characterized in that it comprises a piezoelectric body constituted by a layered Bi compound nanoplate as mentioned above.

A pyroelectric element made of a layered Bi compound nanoplate according to the present invention is characterized in that it comprises a pyroelectric body constituted by a layered Bi compound nanoplate as mentioned above.

A catalytic array made of a layered Bi compound nanoplate array according to the present invention is characterized in that it comprises a layered Bi compound nanoplate array as mentioned above.

EFFECT OF THE INVENTION

Layered Bi compound nanoplates of the present invention those are of a single crystal with its size in the order of nanometers and are even in shape can be used to constitute a material for microminiature piezoelectric elements and pyroelectric elements high in performance.

A layered Bi compound nanoplate array of the present invention in which nanoplates are densely arrayed not in contact with one another can be used to realize a ferroelectric memory with highly integrated memory cells in which a single nanoplate constitutes a single individual cell. Also, a catalyst array if it is used for may have a high catalytic power.

Further, according to the present invention, adopting a bottom-up method allows manufacturing layered Bi compound nanoplate array and nanoplates at low cost.

DESCRIPTION OF REFERENCE CHARACTERS

Figure 1:
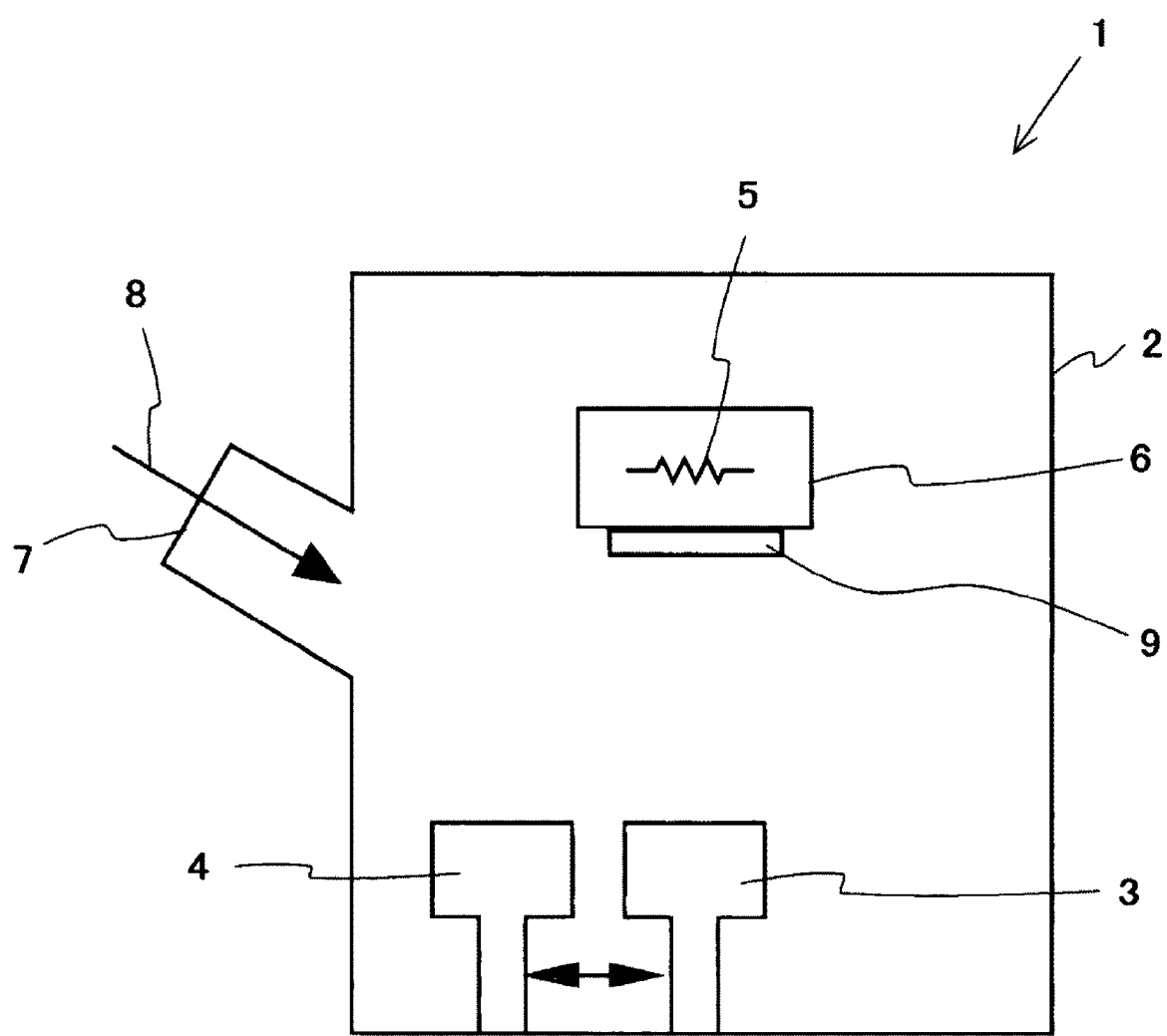
FIG. 1 is a diagram of a laser ablation apparatus used in a method according to the present invention.

1 Laser ablation apparatus
2 Vacuum chamber
3 Target
4 Target
8 Heater
6 Substrate holder
7 Window
8 Laser light
9 Substrate
51 $SrTiO_3$ (001) faced substrate
52 $Bi_4Ti_3O_{12}$ nanoplate
53 Crystal axis coordinates of $Bi_4Ti_3O_{12}$ nanoplate
54 Crystal axis coordinates of $SrTiO_3$ (001) faced substrate
71 Atomic model of $SrTiO_3$ (001) faced substrate
72 $TiO_3$ octahedral block
73 Sr
74 $Bi_4Ti_3O_{12}$ unit atomic block
75 $Bi_4Ti_3O_{12}$ unit atomic block
76 $TiO_6$ octahedral block
77 $Bi_2O_2$ block
78 Bi
81 Power supply
82 Probe
83 Cantilever
84 Cantilever drive unit 85 Reflected laser light
86 Optical path detector
87 Computer
88 $Bi_4Ti_3O_{12}$ nanoplate array
89 $VO_x$ layer
90 $Bi_4Ti_3O_{12}$ nanoplate
91 Nb doped $SrTiO_3$ (001) faced substrate
101 $Bi_4Ti_3O_{12}$ nanoplate array ferroelectric memory
102 $Bi_4Ti_3O_{12}$ nanoplate array
103 Nb doped $SrTiO_3$ (001) faced substrate
104 $Bi_4Ti_3O_{12}$ nanoplate
105 Read and write unit
106 Probe
107 Cantilever
108 Drive unit
109 Power supply
110 Voltage detector
111 Computer
120 $Bi_4Ti_3O_{12}$ nanoplate catalytic array
121 $Bi_4Ti_3O_{12}$ nanoplate array
122 $Bi_4Ti_3O_{12}$ nanoplate

BEST MODES FOR CARRYING OUT THE INVENTION

Hereinafter, the present invention will be described in detail with respect to certain suitable forms of implementation thereof illustrated in the drawing figures.

It should be noted here that in the description of the forms of implementation illustrated below, mention is especially made of a nanoplate and a nanoplate array of $Bi_4Ti_3O_{12}$ compound that is an Aurivillius layered Bi compounds having compositions expressed by formula: $(Bi_2O_2)A_{m-1}B_mO_{3m+1}$ (where A is Sr, Ba, Ca or Bi, B is Ti, Ta or Nb and $m \geq 1$) wherein A is Bi, B is Ti and m is 3, which for the sake of brevity are referred simply to as "$Bi_4Ti_3O_{12}$ nanoplate" and "$Bi_4Ti_3O_{12}$ nanoplate array", respectively, the present invention is equally applicable to other Aurivillius layered Bi compounds.

At the outset, an explanation is given of an apparatus used for carrying out a method of the present invention, whereupon explanations follow in respect of methods of the present invention using the apparatus, and the structure and property of a $Bi_4Ti_3O_{12}$ nanoplate and a $Bi_4Ti_3O_{12}$ nanoplate array made by the methods and then of exemplary applications of a $Bi_4Ti_3O_{12}$ nanoplate according to the present invention.

FIG. 1 is a diagram of a laser ablation apparatus used in a method according to the present invention. The laser ablation apparatus 1 uses a target 3 of sintered $VO_x$ body, a target 4 of sintered $Bi_4Ti_3O_{12}$ body and includes a substrate holder 6 with a built-in substrate temperature controlling heater 5 in a vacuum chamber 2 adapted to be evacuated. The targets are irradiated with pulsed laser light 8 through a window 7 of transparent material provided for the vacuum chamber 2. The targets 3 and 4 are each made movable so that each of the targets 3 and 4 can be moved to a position of irradiation with pulsed laser light 8 whereupon it is irradiated with pulsed laser light 8 to ablate and deposit each given target material on a single-crystal substrate 9 disposed on the substrate holder 6.

Mention is next made of a method of the present invention.

Figure 2:
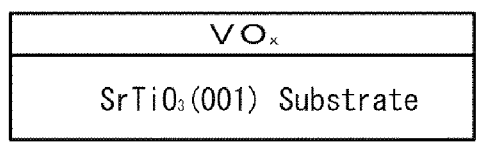
FIG. 2 is a diagram illustrating in order steps in the manufacture of a $Bi_4Ti_3O_{12}$ nanoplate array according to the present invention.
Figure 2:
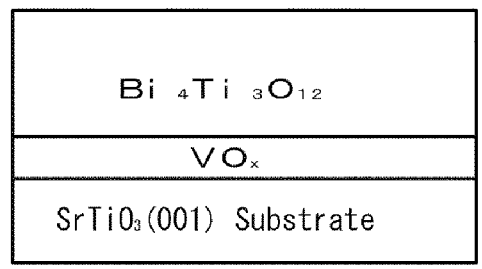
Figure 2:
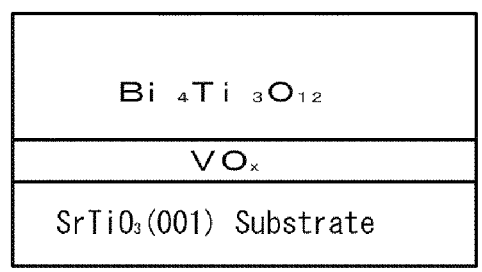

FIG. 2 is a diagram illustrating a method of manufacturing a $Bi_4Ti_3O_{12}$ nanoplate array according to the present invention.

First, a temperature of the single crystal substrate is elevated to a range between 500 and 700° C. and then the $VO_x$ target is ablated by laser to deposit $VO_x$ to a thickness of 30 nm to 60 nm (step 1).

The single crystal substrate is preferably of $SrTiO_3$ single crystal. Alternatively, it may be a $LaAlO_3$, $(LaAlO_3)_{0.3}(Sr_2AlTaO_6)_{0.7}$, Si, $NdGaO_3$, YSZ, $Al_2O_3$, $LaSrAlO_4$, MgO or $LaSrGaO_4$ single crystal.

Also, if the substrate should be electrically conductive depending on an application, then it may be doped with an electrically conductive material, e.g., it may be a Nb doped $SrTiO_3$ single crystal substrate. Alternatively, it may then be a substrate having an electrically conductive thin film deposited thereon and preferably as a thin film resistant to oxidation, a Pr, Ir, $IrO_2$, $RuO_2$, $La_{0.5}Sr_{0.5}CoO_3$, $LaNiO_3$ or $SrRuO_3$ thin film deposited thereon.

The laser ablation is preferably by irradiation with a KrF excimer laser pulse of an intensity of 1 $J/cm^2$ at a rate around 10 Hz.

The composition ratio x of $VO_x$ is preferably held in a range of $1 \leq x \leq 2.5$. In order to maintain the composition of $VO_x$ target in a range of $1 \leq x \leq 2.5$ and to prevent oxygen from depleting during ablation, it is desirable that the ablation be effected in an oxygen atmosphere of about 67 Pascal. The thickness of depositing $VO_x$ should be 30 nm to 60 nm; if it is outside of this range, $Bi_4Ti_3O_{12}$ nanoplate will not grow.

Next, ablating the $Bi_4Ti_3O_{12}$ target while maintaining the single crystal substrate at a temperature of 700° C. gives rises to deposition of $Bi_4Ti_3O_{12}$ to a thickness of about 500 nm to 800 nm (step 2). Conditions of the laser ablation in this step may be the same as in step 1. Also, to prevent oxygen from depleting during ablation it is desirable that the ablation be effected in an oxygen atmosphere of about 67 Pascal. The amount of depositing $Bi_4Ti_3O_{12}$ should, if converted to that of $Bi_4Ti_3O_{12}$ thin film, be about 500 nm to 800 nm thick; if it is outside of this range, $Bi_4Ti_3O_{12}$ nanoplate will not grow. In step 3, a gas such as $N_2$ at room temperature is introduced into the vacuum chamber for cooling to room temperature. The cooling rate is not limited particularly and it may be a rapid cooling finished in around 1 minute.

Mention is next made of a method of making a $Bi_4Ti_3O_{12}$ nanoplate.

A $Bi_4Ti_3O_{12}$ nanoplate can be made by separating a $Bi_4Ti_3O_{12}$ nanoplate from the $Bi_4Ti_3O_{12}$ nanoplates in an array made in a manner as described above, with a physical force or in a chemical agent. Since $VO_x$ and $Bi_4Ti_3O_{12}$ are materials not mutually reacting with each other to form any chemical compound, the $Bi_4Ti_3O_{12}$ nanoplate can be separated without impairment from the single crystal substrate with a physical force of certain strength or in an ordinary chemical agent.

EXAMPLE

Mention is made of the structure and property of a $Bi_4Ti_3O_{12}$ nanoplate and a $Bi_4Ti_3O_{12}$ nanoplate array of the present invention with reference to a specific example.

A nanoplate and a nanoplate array as mentioned above were prepared using the apparatus mentioned above. Single crystal substrates used in the example were a Nb doped $SrTiO_3$ (001) faced substrate, a $LaAlO_3$ (001) faced substrate and a $(LaAlO_3)_{0.3}(Sr_2AlTaO_6)_{0.7}$ (001) faced substrate and the other conditions of preparation were the same as in the method of present invention described above. Also, for purposes of comparison with the prior art, comparative specimens were prepared using Nb doped $SrTiO_3$ (001) faced substrates under the same conditions except that the $VO_x$ flux layer was not deposited.

Figure 3:
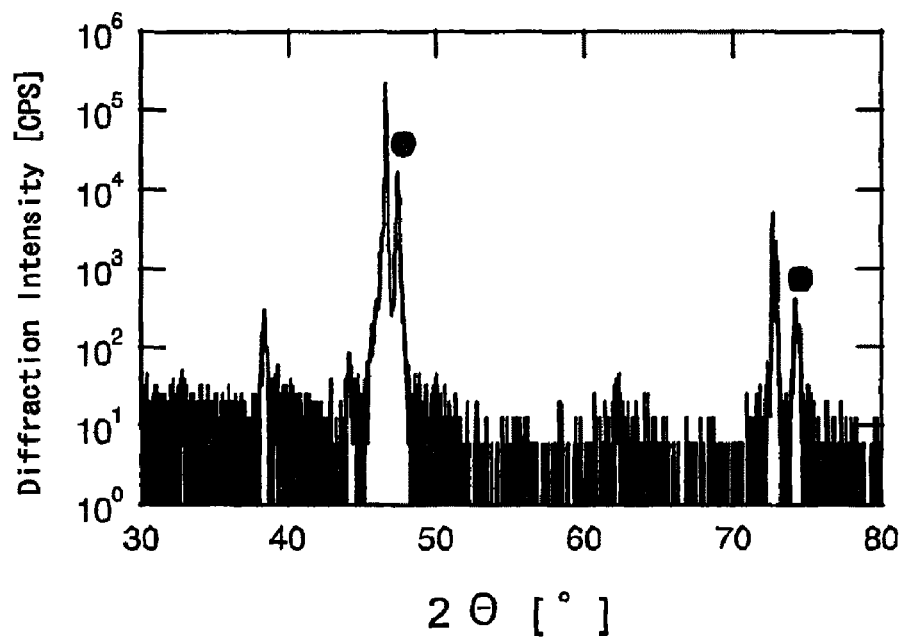
FIG. 3 is a view showing a diffraction pattern by XRD (X-Ray Diffraction meter) of a $Bi_4Ti_3O_{12}$ nanoplate array according to the present invention.
Figure 3:
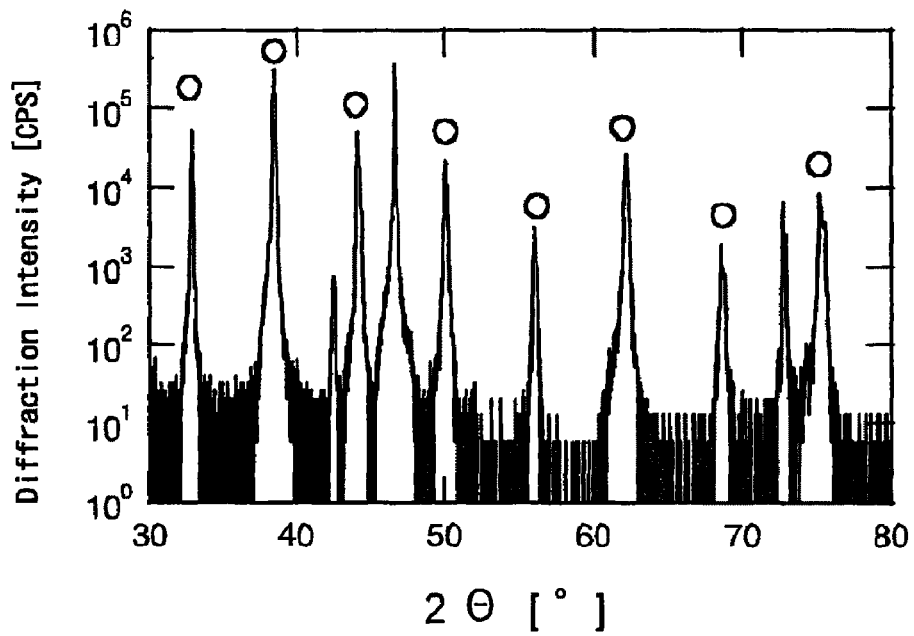

FIG. 3 shows diffraction patterns in graphs by XRD of the specimens prepared using the Nb doped $SrTiO_3$ (001) faced substrates. In each graph, the abscissa axis represents 2θ

(degree) and the ordinate axis represents the diffraction intensity. FIG. 3(a) is an XRD pattern of the specimen prepared and FIG. 3(b) is an XRD pattern of the comparative specimen. The diffraction peaks denoted by ● correspond to diffraction peaks of (110) plane of perovskite slab type layered single crystal structure while diffraction peaks denoted by ○ correspond to those of (001) plane and a plane near (001) plane of perovskite slab type layered single crystal structure. From the fact that in the diffraction pattern of FIG. 3(a) only diffraction peaks of (110) plane were observed, it is seen that the $Bi_4Ti_3O_{12}$ nanoplate of the present invention has its (110) face oriented parallel to the substrate, i.e., is of $Bi_4Ti_3O_{12}$ of (110) oriented perovskite slab type layered single crystal structure. On the other hand, it is seen that the comparative specimen with no $VO_x$ flux layer deposited is of $Bi_4Ti_3O_{12}$ of (001) plane oriented perovskite slab type layered single crystal structure from the fact that only diffraction peaks of (001) plane and a plane near (001) plane were observed in the diffraction pattern of FIG. 3(b).

Figure 4:
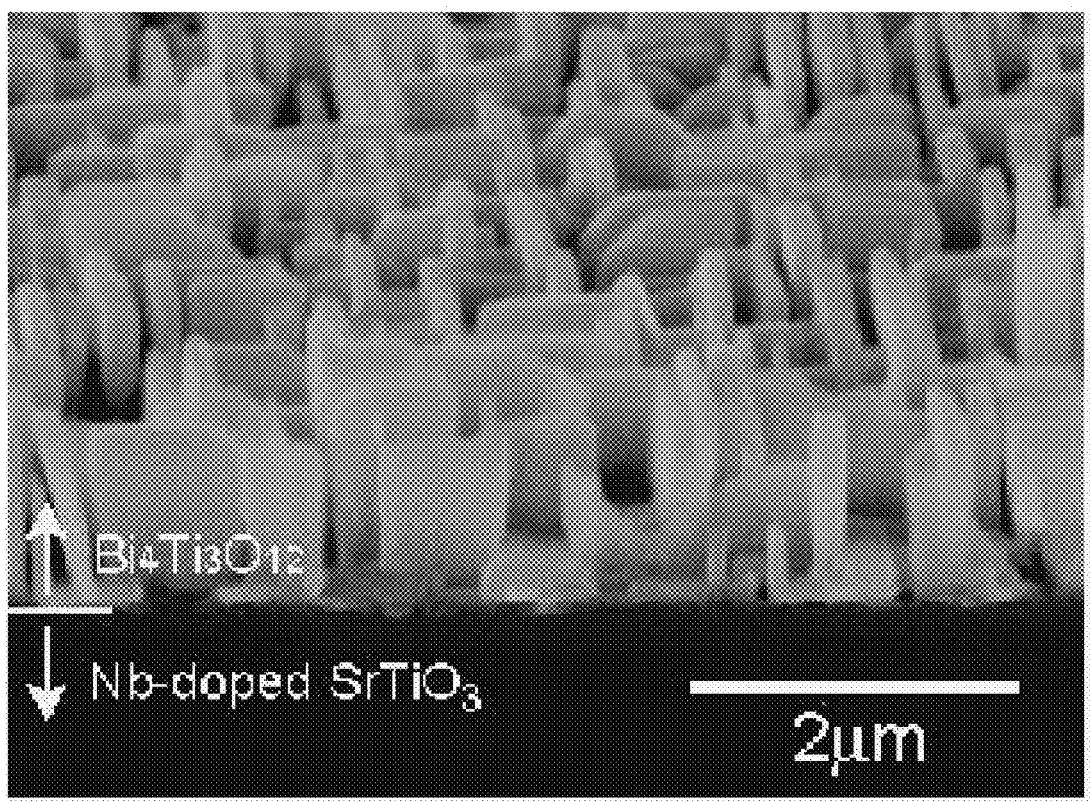
FIG. 4 is a view showing a SEM (Secondary Electron Microscope) image in cross section of a $Bi_4Ti_3O_{12}$ nanoplate array of the present invention prepared using an Nb doped $SrTiO_3$ (001) faced substrate.

FIG. 4 shows a SEM image in cross section of a $Bi_4Ti_3O_{12}$ nanoplate array of the present invention prepared using an Nb doped $SrTiO_3$ (001) faced substrate. The specimen was cleaved perpendicularly to the substrate plane and its image was taken from aslant above. In the image, the lower dark area represents the Nb doped $SrTiO_3$ single crystal substrate, and it is seen that above the dark area, planar objects generally of an identical shape are densely arrayed vertically and horizontally to one another. These objects are $Bi_4Ti_3O_{12}$ nanoplates of the present invention and a whole of the substrate and objects arrayed thereon is a $Bi_4Ti_3O_{12}$ nanoplate array of the present invention. Also, the layer seen gray between $Bi_4Ti_3O_{12}$ nanoplates and the dark area is of $VO_x$.

Figure 5:
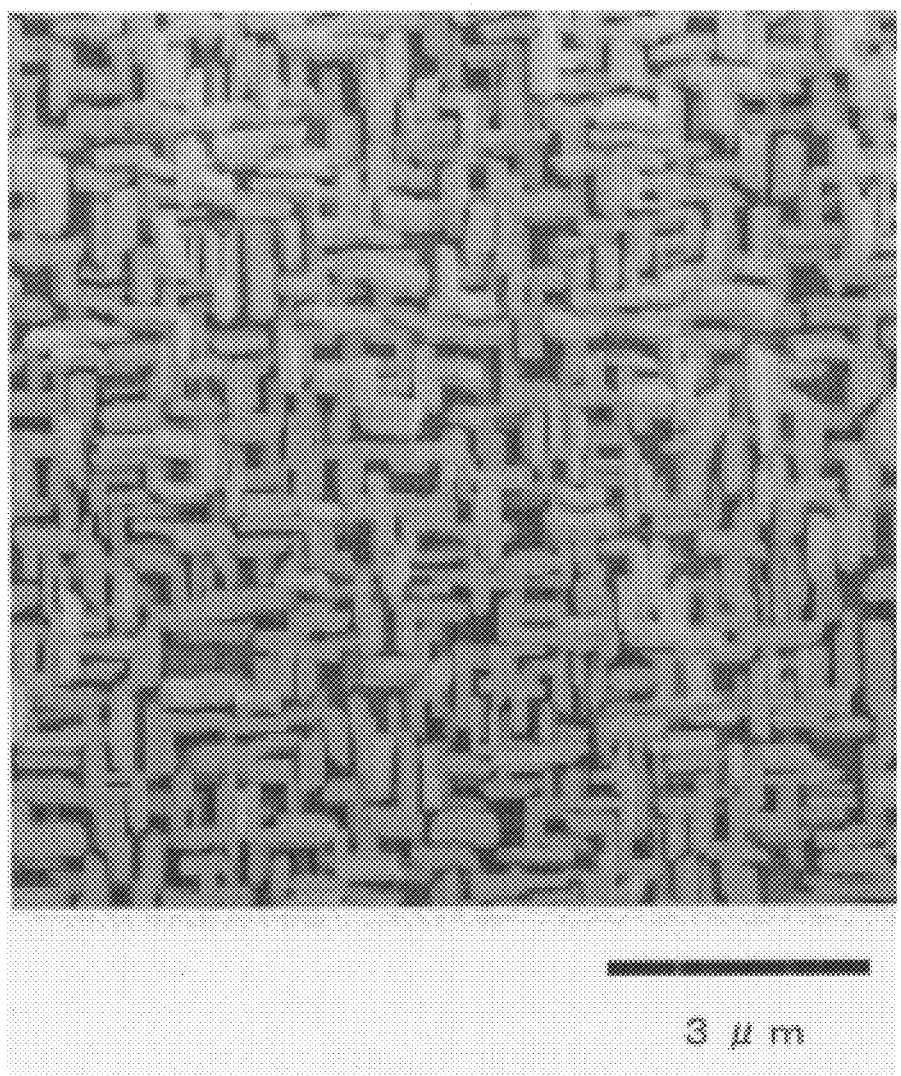
FIG. 5 is a view showing a SEM image of a $Bi_4Ti_3O_{12}$ nanoplate array of the present invention prepared using a $LaAlO_3$ (001) faced substrate, taken from above the substrate.

FIG. 5 shows a SEM image of a $Bi_4Ti_3O_{12}$ nanoplate array of the present invention prepared using the $LaAlO_3$ (001) faced substrate, taken from above the substrate.

Figure 6:
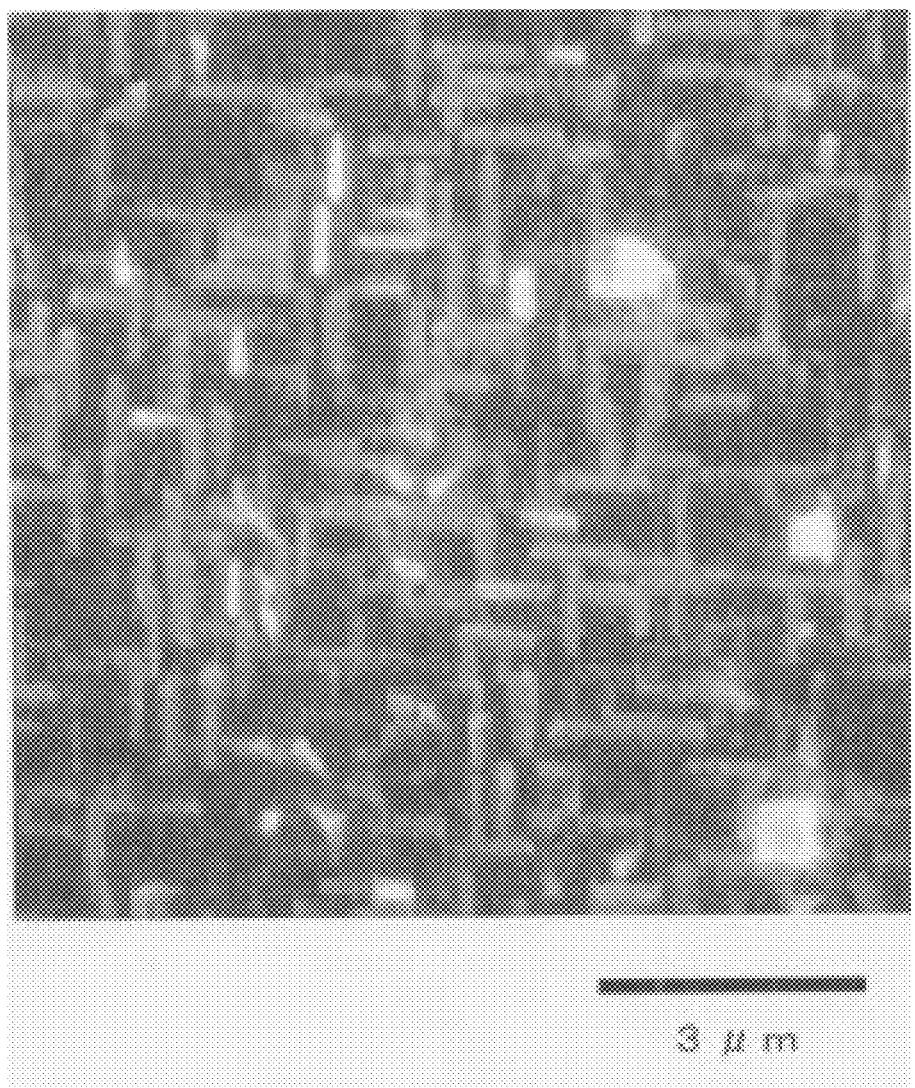
FIG. 6 is a view showing a SEM image of a $Bi_4Ti_3O_{12}$ nanoplate array of the present invention prepared using a $(LaAlO_3)_{0.3}(Sr_2AlTaO_6)_{0.7}$ (001) faced substrate, taken from above the substrate.

FIG. 6 is a view showing a SEM image of a $Bi_4Ti_3O_{12}$ nanoplate array of the present invention prepared using the $(LaAlO_3)_{0.3}(Sr_2AlTaO_6)_{0.7}$ (001) faced substrate, taken from above the substrate.

From FIGS. 5 and 6, it is seen that using a substrate other than the $SrTiO_3$ (001) faced substrate makes it possible to make a $Bi_4Ti_3O_{12}$ nanoplate array as in the use of a $SrTiO_3$ (001) faced substrate.

Figure 7:
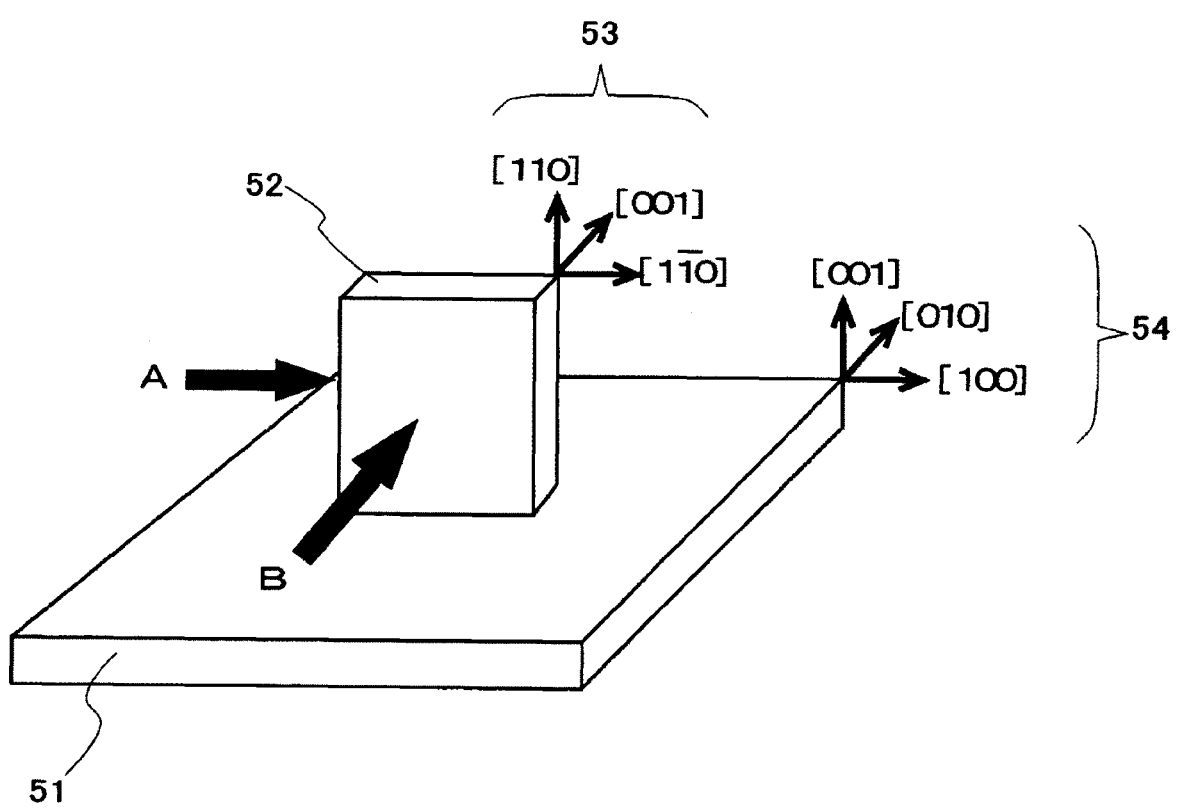
FIG. 7 is a view illustrating an orientation relationship between a $Bi_4Ti_3O_{12}$ nanoplate of the present invention and a single crystal substrate.

FIG. 7 is a view illustrating an orientation relationship between a $Bi_4Ti_3O_{12}$ nanoplate and a single crystal substrate as derived from the SEM image shown in FIG. 4. 51 indicates a $SrTiO_3$ (001) faced substrate, 52 indicates a $Bi_4Ti_3O_{12}$ nanoplate, 53 indicates a coordinate axis showing crystallographic orientations of three independent sides of a $Bi_4Ti_3O_{12}$ nanoplate, and 54 indicates a coordinate axis showing crystallographic orientations of a $SrTiO_3$ (001) faced substrate. Further, in the figure it is shown that the [1-10], [001] and [110] directions of coordinate axis 53 are identical to the [100], [010] and [001] directions of coordinate axis 54, respectively.

From FIGS. 3, 4 and 7, it is seen that a $Bi_4Ti_3O_{12}$ nanoplate of the present invention has a perovskite slab type layered single crystal structure and is in the form of a rectangular solid having its three independent sides in the [1-10], [001] and [110] directions of a perovskite slab type layered $Bi_4Ti_3O_{12}$ single crystal and whose sides in the [1-10], [001] and [110] crystallographic directions are parallel to [100], [010] and [001] crystallographic directions of the $SrTiO_3$ substrate, respectively.

Also, with respect to its size, it is seen that a $Bi_4Ti_3O_{12}$ nanoplate of the present invention has a length of about 1 μm for the sides in the [110] and [1-10] directions and a length of about 300 nm for the side in the [001] direction, or a length of about 1 μm for the sides in the [110] and [001] directions and a length of about 300 nm for the side in the [1-10] direction. It is also seen that such adjacent $Bi_4Ti_3O_{12}$ nanoplates are not in contact with one another but arrayed spaced from one another by a distance of about 500 nm or less.

Figure 8:
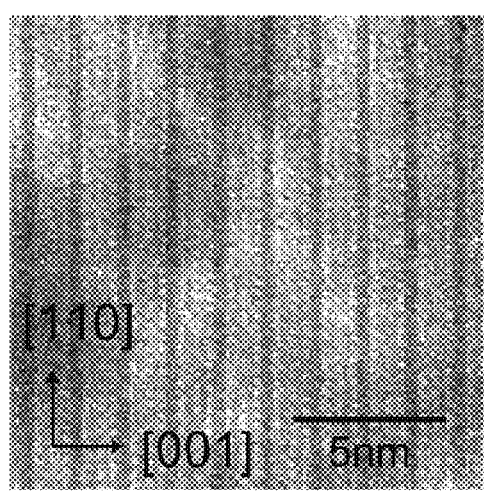
FIG. 8 is a view showing TEM (Transverse Electron Microscope) images and electron beam diffraction images of a $Bi_4Ti_3O_{12}$ nanoplate according to the present invention.
Figure 8:
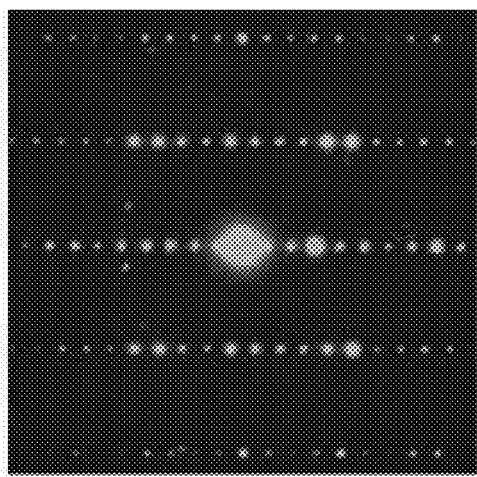
Figure 8:
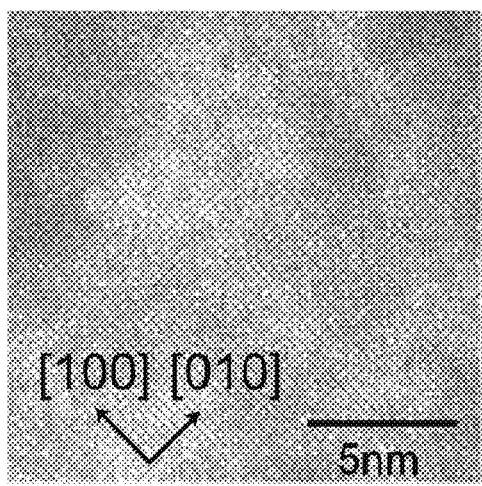
Figure 8:
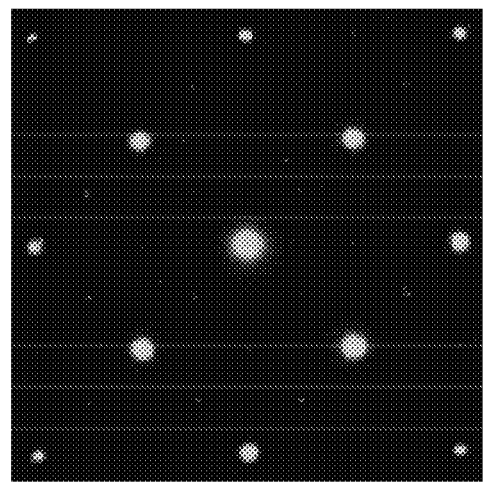

FIG. 8 shows TEM and electron beam diffraction images of the $Bi_4Ti_3O_{12}$ nanoplate according to the present invention irradiated with an electron beam in the directions of A and B indicated in FIG. 7. FIG. 8(a) shows an TEM image measured upon irradiation of an electron beam incident from the A, namely [1-10] direction and FIG. 8(b) shows an electron beam diffraction image then measured. FIG. 8(c) shows a TEM image measured upon irradiation of an electron beam incident from the B, namely [001] direction and FIG. 8(d) shows an electron beam diffraction image then measured. From these Figures, it is seen that the $Bi_4Ti_3O_{12}$ nanoplate is of $Bi_4Ti_3O_{12}$ of perovskite slab type layered single crystal structure.

Mention is next made of the atomic structure of a $Bi_4Ti_3O_{12}$ nanoplate of the present invention.

Figure 9:
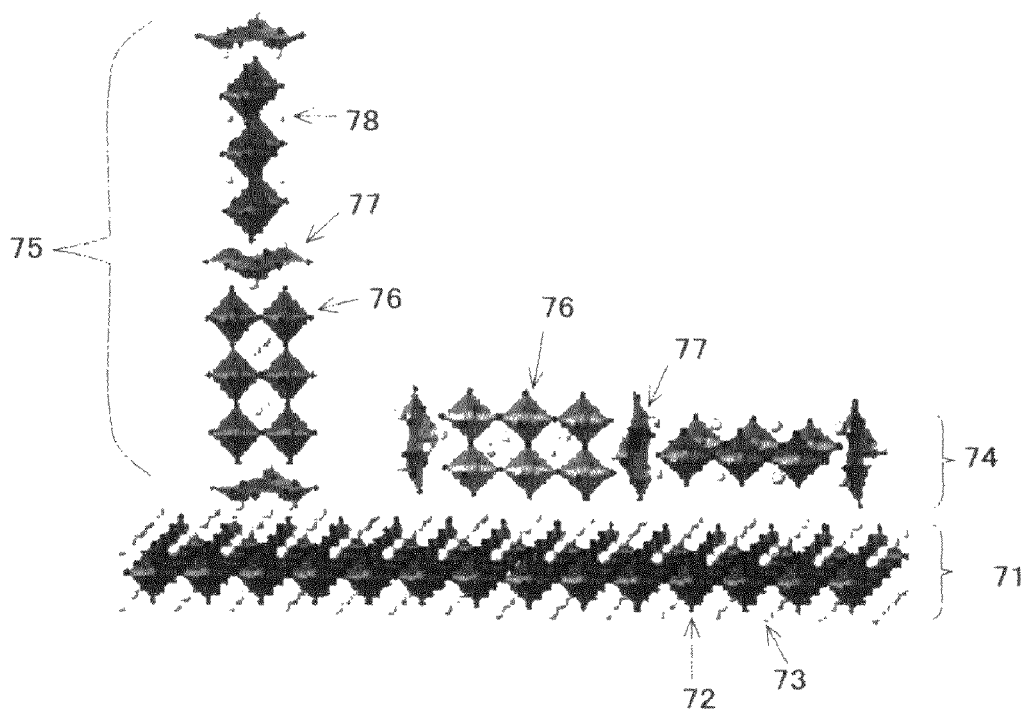
FIG. 9 is a view illustrating atomic structure models of a $Bi_4Ti_3O_{12}$ nanoplate according to the present invention.
Figure 9:
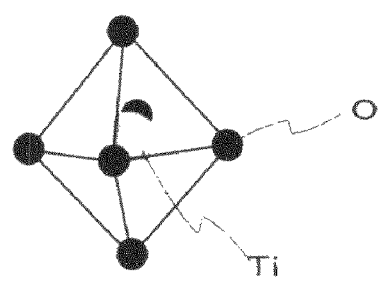
Figure 9:
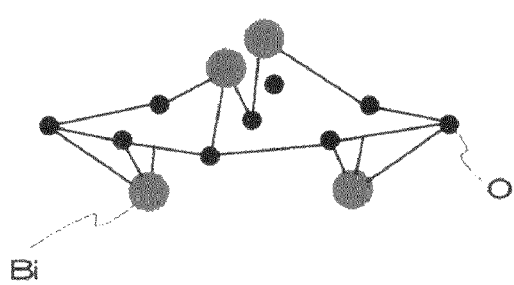

FIG. 9 is a view illustrating atomic structure models of a $Bi_4Ti_3O_{12}$ nanoplate according to the present invention derived from results of the XRD and electron diffraction measurements. As shown, 71 is an atomic model of $SrTiO_3$ (001) faced substrate wherein the blocks 72 in the form of beads of a Japanese abacus are $TiO_3$ octahedral blocks of $SrTiO_3$, and ○ in gray color existing between the layers of such octahedral blocks 72 is Sr.

74 and 75 indicate unit atomic blocks of $Bi_4Ti_3O_{12}$, 76 in the form of an abacus beads are, as shown in FIG. 9(b), $TiO_6$ octahedral blocks of $Bi_4Ti_3O_{12}$, 77 in the form of a sea horse is, as shown in FIG. 9(c), a $Bi_2O_2$ block, and ○ in gray color existing between the blocks are Bi atoms. The $Bi_4Ti_3O_{12}$ unit atomic blocks 74 and 75 have their major axes whose directions correspond to the [001] direction of a perovskite slab type layered $Bi_4Ti_3O_{12}$ crystal.

From the fact that depositing $Bi_4Ti_3O_{12}$ without using $VO_x$ yields $Bi_4Ti_3O_{12}$ crystal of (001) orientation as shown in FIG. 3(b), it is seen that the unit $Bi_4Ti_3O_{12}$ atomic block has its major axis oriented perpendicular to the $SrTiO_3$ (001) substrate plane as indicated at 75.

On the other hand, from the fact that when $VO_x$ is used, the (110) oriented crystal is obtained, it is seen that the unit $Bi_4Ti_3O_{12}$ atomic block then has its major axis oriented parallel to the $SrTiO_3$ (001) substrate plane as indicated at 74. Such orientation has not hitherto been known, but has first been found out by the present inventors.

Mention is made of piezoelectric property of a $Bi_4Ti_3O_{12}$ nanoplate of the present invention.

Figure 10:
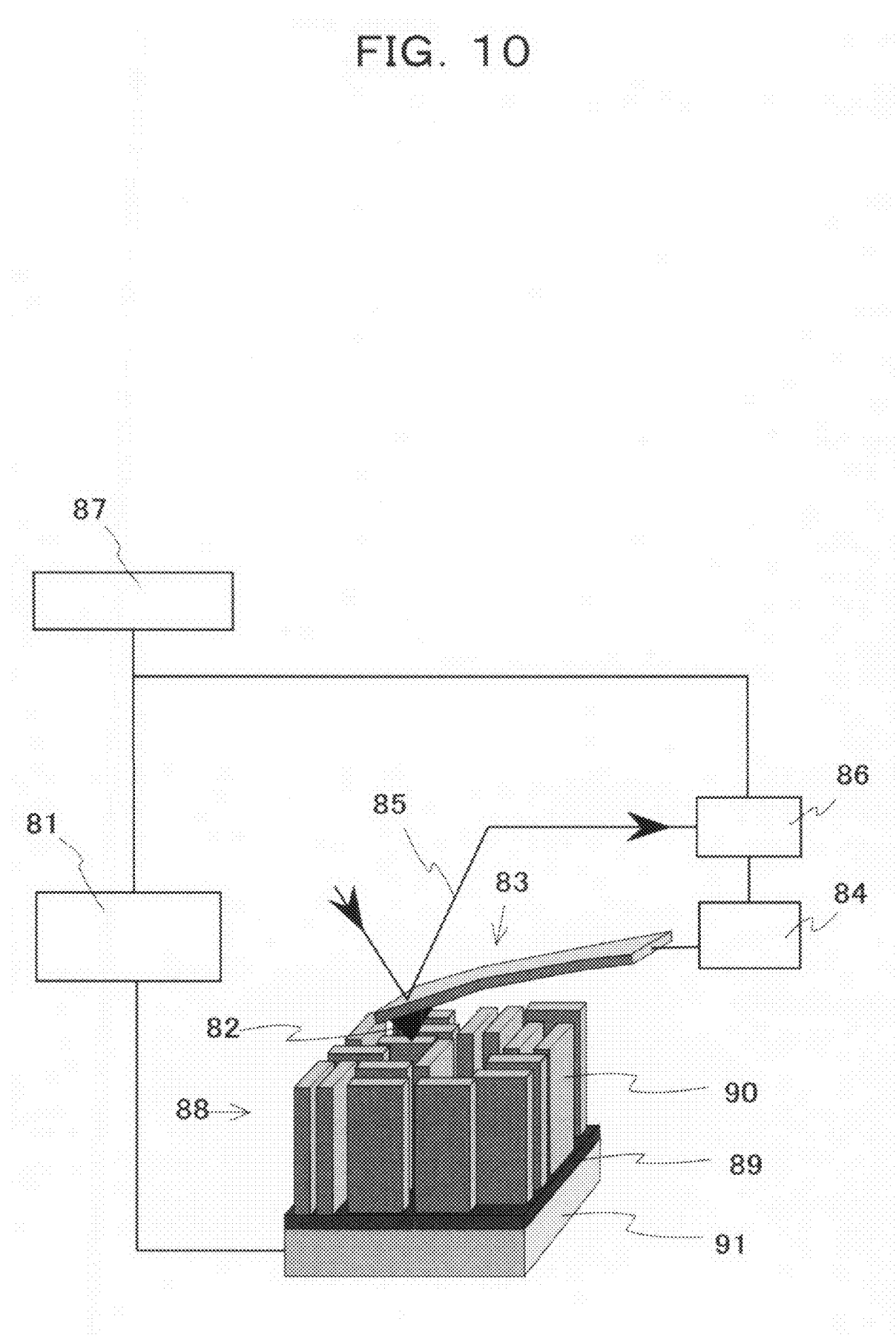
FIG. 10 is a diagram illustrating a measuring system used in the measurement of piezoelectric properties of a $Bi_4Ti_3O_{12}$ nanoplate according to the present invention.

FIG. 10 shows a measuring system used in the measurement of piezoelectric property of a $Bi_4Ti_3O_{12}$ nanoplate according to the present invention. As shown in the figure, the measuring system comprises a voltage generator 81, a cantilever 83 having a probe 82 at its end, a drive unit 84 for moving the cantilever 83, an optical path detector 86 for detecting the optical path of laser light 85 reflected by the back face of the cantilever 83 and a computer 87 for controlling the voltage generated by the voltage generator 81 and taking in a detected signal of the optical path detector 86.

The specimen used in the measurement was a $Bi_4Ti_3O_{12}$ nanoplate array 88 of the present invention. The probe 82 was brought into contact with the top face of a $Bi_4Ti_3O_{12}$ nanoplate 90 which stood upright on a $VO_x$ layer 89. A voltage from the voltage generator 81 was applied between the probe 82 and a Nb doped $SrTiO_3$ (001) faced substrate 91 of the array 88. The voltage applied causes the $Bi_4Ti_3O_{12}$ nanoplate 90 to elongate or contract and in turn the cantilever 83 to deflect. A change in deflection causes the optical path of the reflected laser light 85 to change. Thus, from the optical path information detected by the optical path detector 86, an amount of elongation or contraction of the nanoplate was computed and its piezoelectric constant was then derived.

Figure 11:
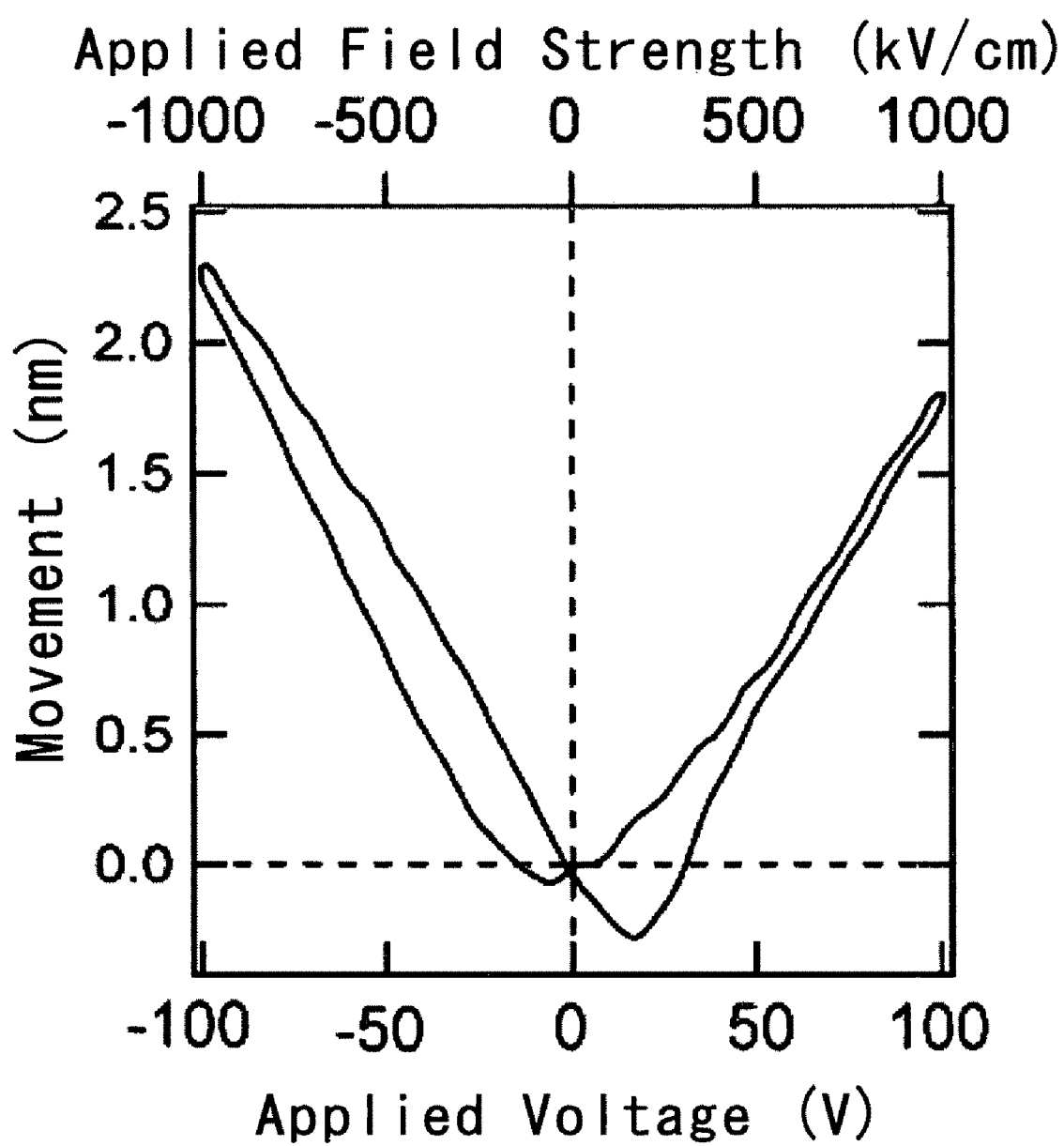
FIG. 11 is a graph illustrating results of measurement of piezoelectric constant of a $Bi_4Ti_3O_{12}$ nanoplate according to the present invention.

FIG. 11 is a graph illustrating results of the measurement of piezoelectric constant of the $Bi_4Ti_3O_{12}$ nanoplate according to the present invention. In the graph of FIG. 11, the lower abscissa axis represents the applied voltage, the upper abscissa axis represents the applied electric field strength, and the ordinate axis represents the displacement. Found from the gradient in the graph, the piezoelectric constant: $d_{33}$=21.5 pm/V. This value is an equivalent to the value of perovskite type $Bi_4Ti_3O_{12}$ single crystal. It is thus seen that a $Bi_4Ti_3O_{12}$ nanoplate can be used as a piezoelectric material for microminiature piezoelectric elements.

Mention is next made of applications of a $Bi_4Ti_3O_{12}$ nanoplate and $Bi_4Ti_3O_{12}$ nanoplate array.

Figure 12:
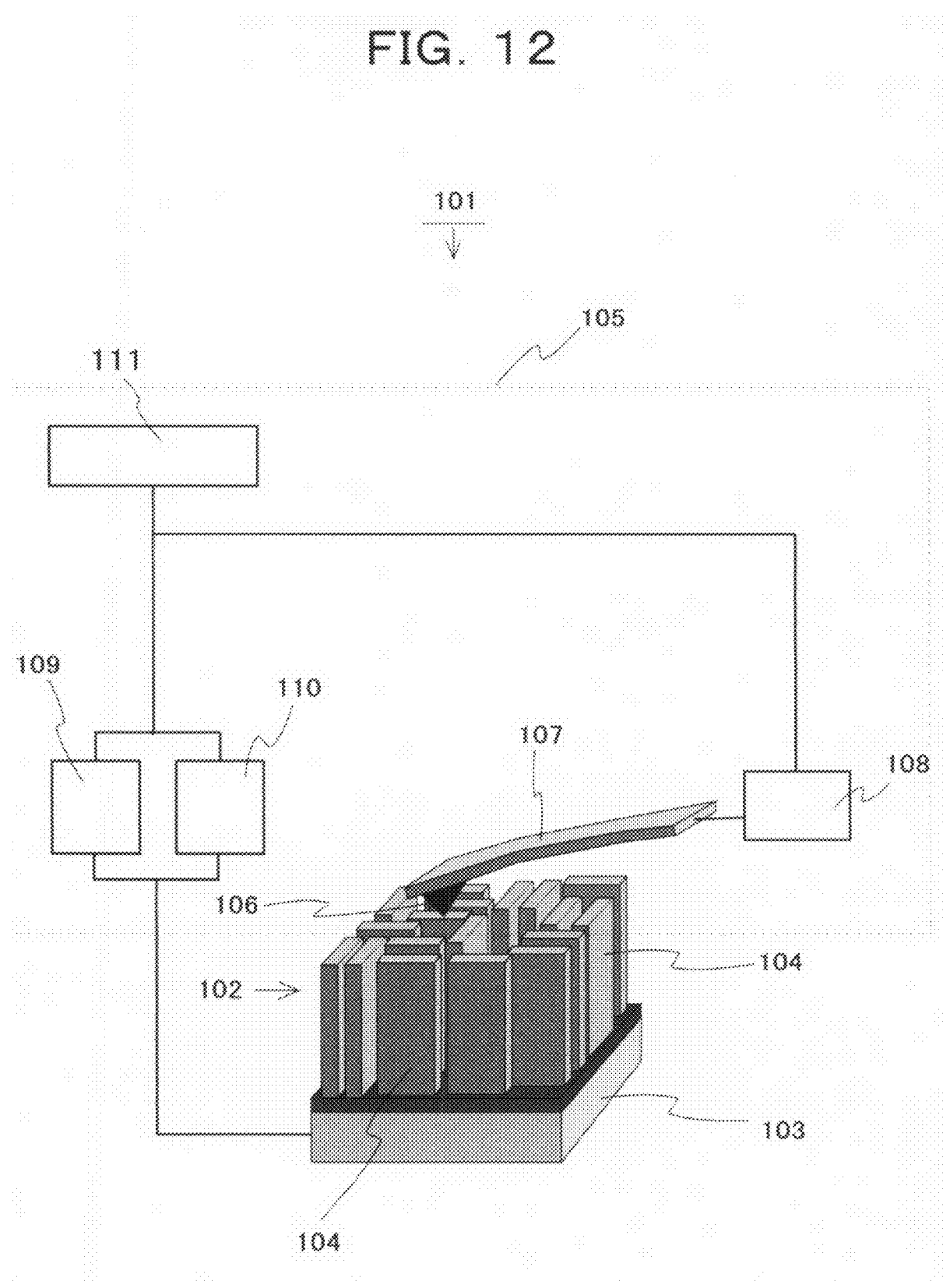
FIG. 12 is a view and diagram illustrating the structure of a ferroelectric memory using a $Bi_4Ti_3O_{12}$ nanoplate array according to the present invention.

FIG. 12 is a view and diagram illustrating the structure of a ferroelectric memory using a $Bi_4Ti_3O_{12}$ nanoplate array according to the present invention. As shown in the Figure, a ferroelectric memory 101 of the present invention is characterized in that it comprises a lower electrode 103 constituted by an electrically conductive single crystal substrate of a $Bi_4Ti_3O_{12}$ nanoplate array 102, memory cells 104 constituted by $Bi_4Ti_3O_{12}$ nanoplates and a read and write unit 105 disposed above the $Bi_4Ti_3O_{12}$ nanoplates 104.

The read and write unit 105 comprises a cantilever 107 having a probe 106, a cantilever drive unit 108 for moving the cantilever 107, a power supply 109 for producing a write voltage that is applied between the probe 106 and the lower electrode 103, a voltage detector 110 for reading a voltage between the probe 106 and the lower electrode 103, and a computer 111 for controlling the drive unit 108, the power supply 109 and the voltage detector 110 based upon the outside command, and writing information in a memory cell at a selected position or reading information from a memory cell at a selected position.

The memory so constructed as mentioned above operates as follows. Receiving a command to write information 1 at a selected memory cell 104 from the outside, the computer 111 delivers a control signal to the cantilever drive unit 108 to control its operation so that the probe 106 of the cantilever 107 is brought to a position above and adjacent to the selected memory cell 104. Then, the probe 106 comes into contact with the top of the memory cell 104 attracted by an interatomic force with a top of the memory cell 104. The computer 111 then delivers a control signal to the power supply 109 to control its operation so that it generates a write voltage. When the write operation ends, the computer 111 delivers a control signal to the cantilever drive unit 108 to control its operation so that the probe 106 is moved up from the memory cell 104.

Receiving a command to read information from a selected memory cell 104 from the outside, the computer 111 delivers a control signal to the cantilever drive unit 108 to control its operation so that the probe 106 at the end of the cantilever 107 is brought to a position above and adjacent to the selected memory cell 104. Then, the probe 106 comes into contact with the top of the memory cell 104 attracted by an interatomic force with a top of the memory cell 104. The computer 111 then delivers a control signal to the voltage detector 110 to control its operation so that it reads a voltage at the selected memory 104. When the read operation ends, the computer 111 delivers a control signal to the cantilever drive unit 108 to control its operation so that the probe 106 is moved up from the memory cell 104.

Use is also made of the detection of a change in optical path of reflected laser light with a deflection of the cantilever as generally utilized in the AFM (Atomic Force Microscope). Thus, the probe can be quickly brought into contact with an aimed memory cell by detecting the direction in which the interatomic force is exerted, from the information of a change in optical path of reflected laser light with a deflection of the cantilever and moving the probe in the direction detected.

The ferroelectric memory according to the present invention, in which $Bi_4Ti_3O_{12}$ nanoplates are not in contact with one another and lie arrayed very densely so that a single $Bi_4Ti_3O_{12}$ nanoplate acts as a single memory cell, can be realized as a highly densified ferromagnetic memory cell at low cost.

Mention is next made of a piezoelectric element and a pyroelectric element according to the present invention.

A piezoelectric element according to the present invention comprises a piezoelectric body constituted by a $Bi_4Ti_3O_{12}$ nanoplate and a pair of electrodes provided at a pair of opposed surfaces of the piezoelectric body, respectively (not shown). Also, a pyroelectric element according to the present invention comprises like the piezoelectric element a pyroelectric body constituted by a $Bi_4Ti_3O_{12}$ nanoplate and a pair of electrodes provided at a pair of opposed surfaces of the pyroelectric body, respectively (not shown).

Since $VO_x$ and $Bi_4Ti_3O_{12}$ are materials mutually not reacting to form any chemical compound, a $Bi_4Ti_3O_{12}$ nanoplate can be separated with an ordinary chemical agent without impairment from a single crystal substrate and a microminiature piezoelectric element or pyroelectric element can be realized which consists of a single $Bi_4Ti_3O_{12}$ nanoplate.

Figure 13:
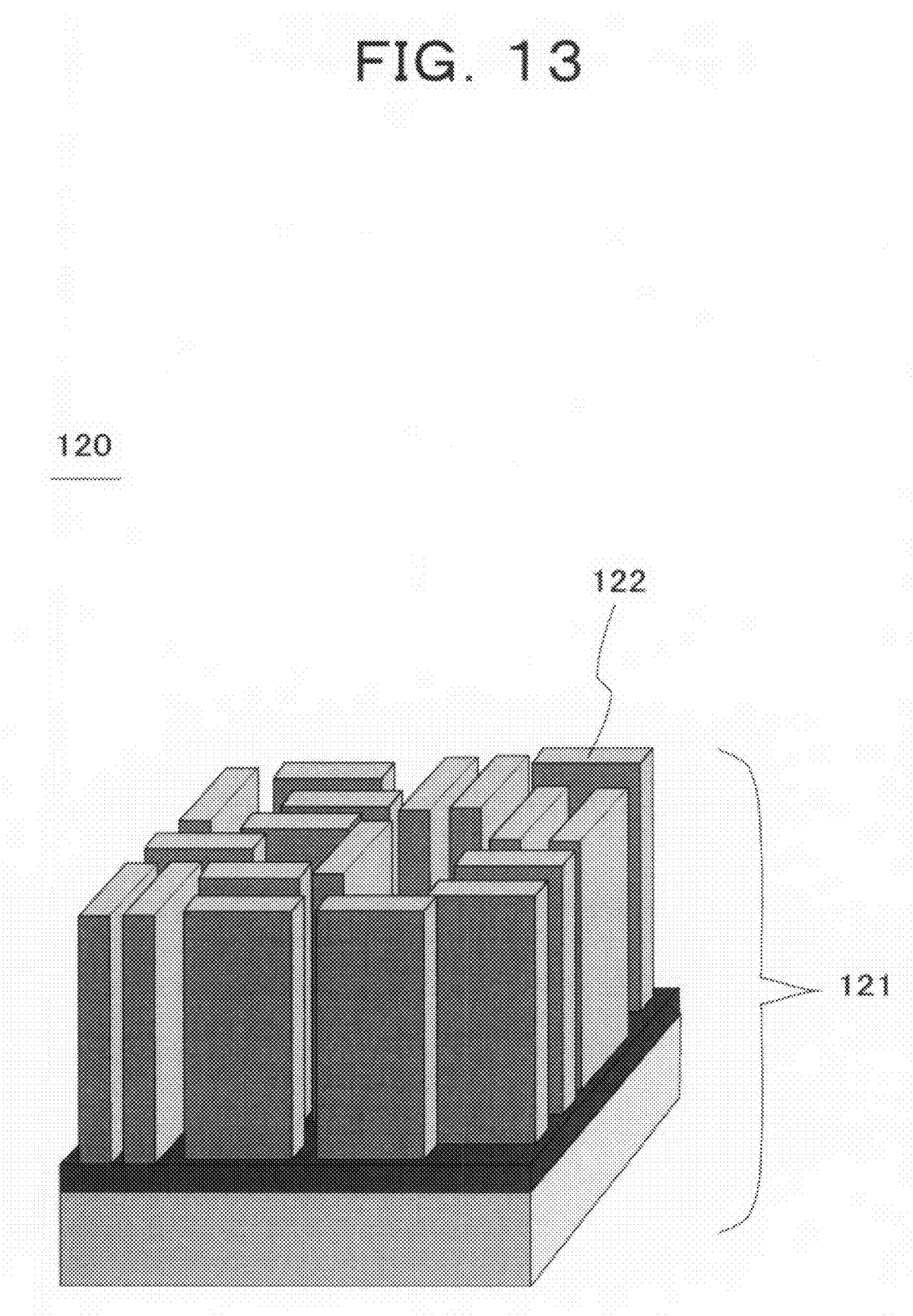
FIG. 13 is a view illustrating the structure of a catalytic array using a $Bi_4Ti_3O_{12}$ nanoplate according to the present invention.

FIG. 13 is a view illustrating the structure of a catalytic array using a $Bi_4Ti_3O_{12}$ nanoplate array according to the present invention. The $Bi_4Ti_3O_{12}$ nanoplate array 121 of the present invention is used itself as the catalytic array 120 of the present invention.

The catalytic array according to the present invention in which $Bi_4Ti_3O_{12}$ nanoplates 122 constituted by $Bi_4Ti_3O_{12}$ that is a material having a photocatalytic effect (see Non-patent Reference 4) are not in contact with one another and lie arrayed very densely is larger in catalytically active surface area and thus larger in photocatalytic function than a thin film $Bi_4Ti_3O_{12}$ catalyst.

INDUSTRIAL APPLICABILITY

According to the present invention, layered Bi compound nanoplates each of which is an Aurivillius layered Bi compound single crystal and which not in contact with one another are arrayed very densely as a layered Bi compound nanoplate array can be fabricated in a bottom-up method, permitting the ferroelectric memory that is high in density or the catalytic array that is high in photocatalytic function to be manufactured at low cost. Also, layered Bi compound nanoplates each of which is an Aurivillius layered Bi compound single crystal can easily be fabricated from a layered Bi compound nanoplate array prepared by a bottom-up method, permitting a microminiature sensor or actuator as may be necessary in MEMS and others to be manufactured at reduced cost.

What is claimed is:

1. A layered Bi compound nanoplate comprising an Aurivillius layered Bi Compound single crystal having a composition expressed by formula: $(Bi_2O_2)A_{m-1}B_mO_{3m+1}$, where A is Sr, Ba, Ca or Bi, B is Ti, Ta or N and $m \geq 1$, wherein the layered Bi compound nanoplate has its composition expressed by $Bi_4Ti_3O_{12}$ and its crystal structure that is a perovskite slab type layered structure and is in the form of a rectangular solid having three independent sides in [1-10], [001] and [110] directions of said crystal structure and of which the sides in the [110] and [1-10] directions have a length of about 1 μm and the side in the [001] direction has a length of about 300 nm or the sides in the [110] and [001] directions have a length of about 1 μm and the side in the [1-10] direction has a length of about 300 nm.

2. A layered Bi compound nanoplate array characterized in that it comprises a single crystal substrate, a $VO_x$ flux layer (where x is a composition ratio; $1 \leq x \leq 2.5$) disposed on said single crystal substrate and a plurality of layered Bi compound nanoplates as set forth in claim 1 disposed on said flux layer wherein said nanoplates are arrayed on said flux layer so that the three independent sides of each of said nanoplates are crystallographically oriented in directions which are coincident with particular crystallographic directions of said single crystal substrate and wherein said plurality of nanoplates are arrayed not in contact with one another.

3. The layered Bi compound nanoplate array as set forth in claim 2, characterized in that said single crystal substrate is a $SrTiO_3$ single crystal substrate, a Nb doped $SrTiO_3$ single crystal substrate, a $LaAlO_3$ single crystal substrate, a $(LaAlO_3)_{0.3}(Sr_2AlTaO_6)_{0.7}$ single crystal substrate, a Si single crystal substrate, a $NdGaO_3$ single crystal substrate, a YSZ single crystal substrate, an $Al_2O_3$ single crystal substrate, a $LaSrAlO_4$ single crystal substrate, a MgO single crystal substrate or a $LaSrGaO_4$ single crystal substrate.

4. The layered Bi compound nanoplate array as set forth in claim 2, characterized in that said single crystal substrate is a single crystal substrate selected from group which consist of a $SrTiO_3$ single crystal substrate, a $LaAlO_3$ single crystal substrate, a $(LaAlO_3)_{0.3}(Sr_2AlTaO_6)_{0.7}$ single crystal substrate, a Si single crystal substrate, a $NdGaO_3$ single crystal substrate, a YSZ single crystal substrate, an $Al_2O_3$ single crystal substrate, a $LaSrAlO_4$ single crystal substrate, a MgO single crystal substrate and a $LaSrGaO_4$ single crystal substrate and a thin film deposited thereon wherein said thin film is of a material selected from the group which consists of Pr, Ir, $IrO_2$, $RuO_2$, $La_{0.5}Sr_{0.5}CoO_3$, $LaNiO_3$ and $SrRuO_3$.

5. The layered Bi compound nanoplate array as set forth in claim 2, characterized in that said single crystal substrate is a SrTiO3 single crystal substrate and that the three independent sides of each of said nanoplates are crystallographically oriented in directions coincident with particular crystallographic directions of said single crystal substrate such that these sides are oriented in [1-10], [001] and [110] crystallographic directions of the crystal structure of said compound, which are coincident, respectively, with [100], [010] and [001] crystallographic directions of said single crystal substrate and wherein said nanoplates arrayed not in contact with one another are arrayed spaced from one another by a distance of 500 nm or less.

6. A ferroelectric memory made of a layered Bi compound nanoplate array, characterized in that it comprises a layered Bi compound nanoplate array as set forth in any one of claims 2 to 5 and a read and write unit disposed above said array wherein nanoplates of said nanoplate array constitute individual memory cells.

7. The ferroelectric memory made of the layered Bi compound nanoplate array as set forth in claim 6, characterized in that said read and write unit comprises:
　　a cantilever having a probe disposed above said nanoplate array;
　　a cantilever moving means for moving said cantilever;
　　a power supply for driving said cantilever moving means to bring said probe into contact with a top of a selected nanoplate in said nanoplate array and for generating a write voltage to be applied between said probe and said single crystal substrate for said array ;
　　a voltage detector for reading a voltage between said probe and said lower electrode when said probe is brought into contact with the top of the selected nanoplate by driving said cantilever moving means ; and
　　a computer responsive to an external command for controlling operations of said moving means, said power supply and said voltage detector to write and read an electric polarization as information for said selected nanoplate in response to external commands, respectively.

8. A piezoelectric element made of a layered Bi compound nanoplate, characterized in that it comprises a piezoelectric body constituted by the layered Bi compound nanoplate as set forth in claim 1.

9. A pyroelectric element made of a layered Bi compound nanoplate, characterized in that it comprises a pyroelectric body constituted by the layered Bi compound nanoplate as set forth in claim 1.

10. A catalytic array made of a layered Bi compound nanoplate array, characterized in that it comprises the layered Bi compound nanoplate array as set forth in claim 2.

* * * * *